(12) United States Patent
Attlesey

(10) Patent No.: US 8,089,765 B2
(45) Date of Patent: Jan. 3, 2012

(54) EXTRUDED SERVER CASE

(75) Inventor: Chad Daniel Attlesey, Rochester, MN (US)

(73) Assignee: Hardcore Computer, Inc., Rochester, MN (US)

( * ) Notice: Subject to any disclaimer, the term of this patent is extended or adjusted under 35 U.S.C. 154(b) by 0 days.

(21) Appl. No.: 13/182,866

(22) Filed: Jul. 14, 2011

(65) Prior Publication Data

US 2011/0267768 A1 Nov. 3, 2011

Related U.S. Application Data

(60) Provisional application No. 61/378,046, filed on Aug. 30, 2010.

(51) Int. Cl.
*H05K 7/20* (2006.01)

(52) U.S. Cl. .......... 361/699; 361/679.53; 361/689; 361/715; 361/727; 165/80.4; 165/80.5; 165/104.19; 165/104.21; 62/3.6; 62/259.2

(58) Field of Classification Search .......... 361/679.46, 361/679.47, 679.53, 679.54, 688, 689, 699–701, 361/715–727, 732, 756, 831; 165/80.3, 80.4, 165/80.5, 104.19, 104.21, 104.22, 104.33, 165/104.34, 185; 62/64, 121, 171, 310, 3.6, 62/376, 132, 259.2; 257/713–719, 723–727; 174/15.1, 16.3, 252

See application file for complete search history.

(56) References Cited

U.S. PATENT DOCUMENTS

| 3,741,292 | A  | * | 6/1973  | Aakalu et al. ........... 165/104.21 |
| 6,052,284 | A  | * | 4/2000  | Suga et al. ..................... 361/699 |
| 7,463,485 | B1 | * | 12/2008 | Nishimura .................... 361/699 |
| 7,885,070 | B2 | * | 2/2011  | Campbell et al. ............. 361/699 |
| 7,911,782 | B2 |   | 3/2011  | Attlesey et al. |
| 7,911,793 | B2 |   | 3/2011  | Attlesey |
| 7,961,475 | B2 | * | 6/2011  | Campbell et al. ............. 361/748 |
| 2007/0133171 | A1 | * | 6/2007 | Cheon .......................... 361/699 |

* cited by examiner

*Primary Examiner* — Michail V Datskovskiy
(74) *Attorney, Agent, or Firm* — Hamre, Schumann, Mueller & Larson, P.C.

(57) ABSTRACT

A liquid submersion cooled computer that includes a seamless, extruded main body used to form a liquid-tight case holding a cooling liquid that submerges components of the computer. By forming the main body as a seamless extrusion, the number of possible leakage paths from the resulting liquid-tight case is reduced. No seams are provided on the main body, and there are no openings through the walls of the main body, so liquid cannot leakage through the main body. Any leakage paths are limited to joints between the main body and end walls which are sealingly attached to the main body to form the liquid-tight case.

18 Claims, 7 Drawing Sheets

EXTRUDED SERVER CASE

This application claims the benefit of U.S. Provisional Application 61/378,046 filed Aug. 30, 2010, which application is incorporated by reference herein in its entirety.

FIELD

This disclosure relates to a liquid submersion cooled computer, for example a server computer or a personal computer.

BACKGROUND

Examples of liquid submersion cooled computers are disclosed in U.S. Pat. No. 7,403,392 and in U.S. Patent Application Publication No. 2009/0260777.

SUMMARY

A liquid submersion cooled computer is described that includes a seamless, extruded main body used to form a liquid-tight case holding a cooling liquid that submerges components of the computer. By forming the main body as a seamless extrusion, the number of possible leakage paths from the resulting liquid-tight case is reduced. No seams are provided on the main body, and there are no openings through the walls of the main body, so liquid cannot leakage through the main body. Any leakage paths are limited to joints between the main body and end walls which are sealingly attached to the main body to form the liquid-tight case.

The liquid submersion cooled computer can be any type of computer. For example, the computer can be a server computer. A liquid submerged server computer is described in U.S. Patent Application Publication No. 2009/0260777 which is incorporated herein by reference in its entirety. In another example, the computer can be a personal computer. A liquid submerged personal computer is described in U.S. Pat. No. 7,403,392 which is incorporated herein by reference in its entirety.

The extruded main body can be formed from any extrudable material. For example, the main body can be extruded from a metal including, but not limited to, aluminum, or from a polymeric material such as a thermosetting plastic.

In one embodiment, a liquid submersion cooled server computer includes a liquid-tight case having a main body that includes a plurality of walls defining an interior space. The main body also includes a first end and a second end. The main body is seamless and formed from an extruded material. In addition, the walls of the main body are devoid of openings therethrough so that the interior space is not in communication with an exterior of the main body through the plurality of walls. The case further includes a first end wall closing the first end and a second end wall closing the second end. A server logic board is disposed in the interior space of the main body, and heat generating computer components, including a processor, are disposed on the server logic board. A dielectric cooling liquid is disposed within the interior space and submerges the plurality of heat generating computer components, including the processor, disposed on the server logic board. In addition, a liquid inlet for dielectric cooling liquid and a liquid outlet for dielectric cooling liquid are provided on the first end wall or on the second end wall.

The term "seamless" is intended to mean that the walls of the main body are not initially separate from each other and then joined together. The joining of separate walls to form the main body would create seams between the walls which increases the chances of a failure or defect in the joint between two of the walls, thereby creating a leakage path for the cooling liquid from the interior of the case. In contrast, by forming the main body as a seamless extrusion, the walls of the main body are integrally formed, and there are no seams between the walls. As a result, there are no leakage paths through the main body.

In another embodiment, a server computer case comprises a plurality of walls defining an interior space, the walls having a first end and a second end. The walls are seamless and are formed from an extruded material, and the walls are devoid of openings therethrough so that the interior space is not in communication with ambient air through the plurality of walls. Ridges are formed on outer surfaces of the plurality of walls at the first end and the second end, and the ridges include threaded holes at the first end and the second end for receiving threaded fasteners that are used to secure end walls to the case to define a liquid-tight case.

DRAWINGS

DETAILED DESCRIPTION

Figure 1:
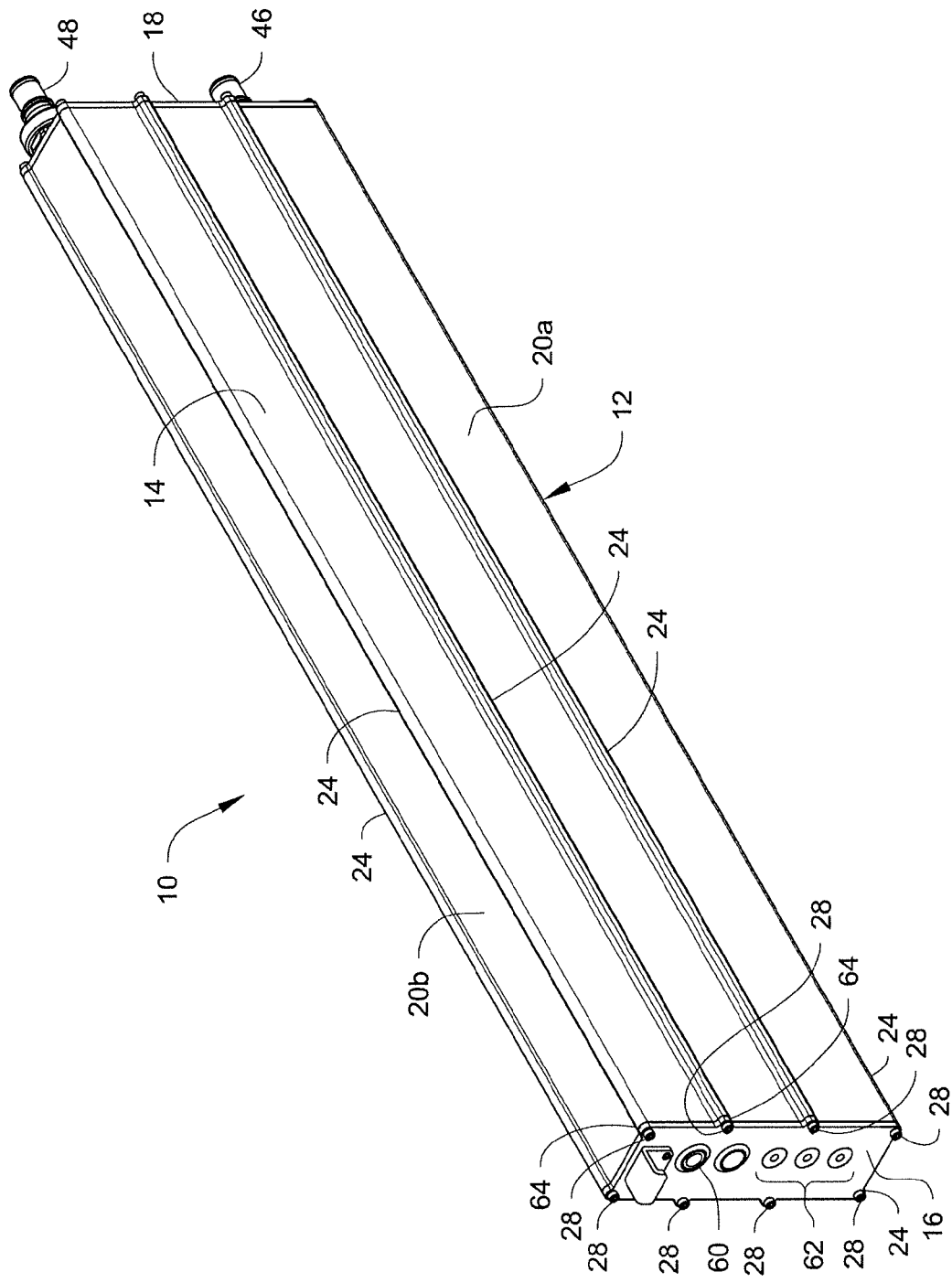
FIG. 1 is a perspective view of a liquid submersion cooled server computer with an extruded case as described herein.
Figure 2:
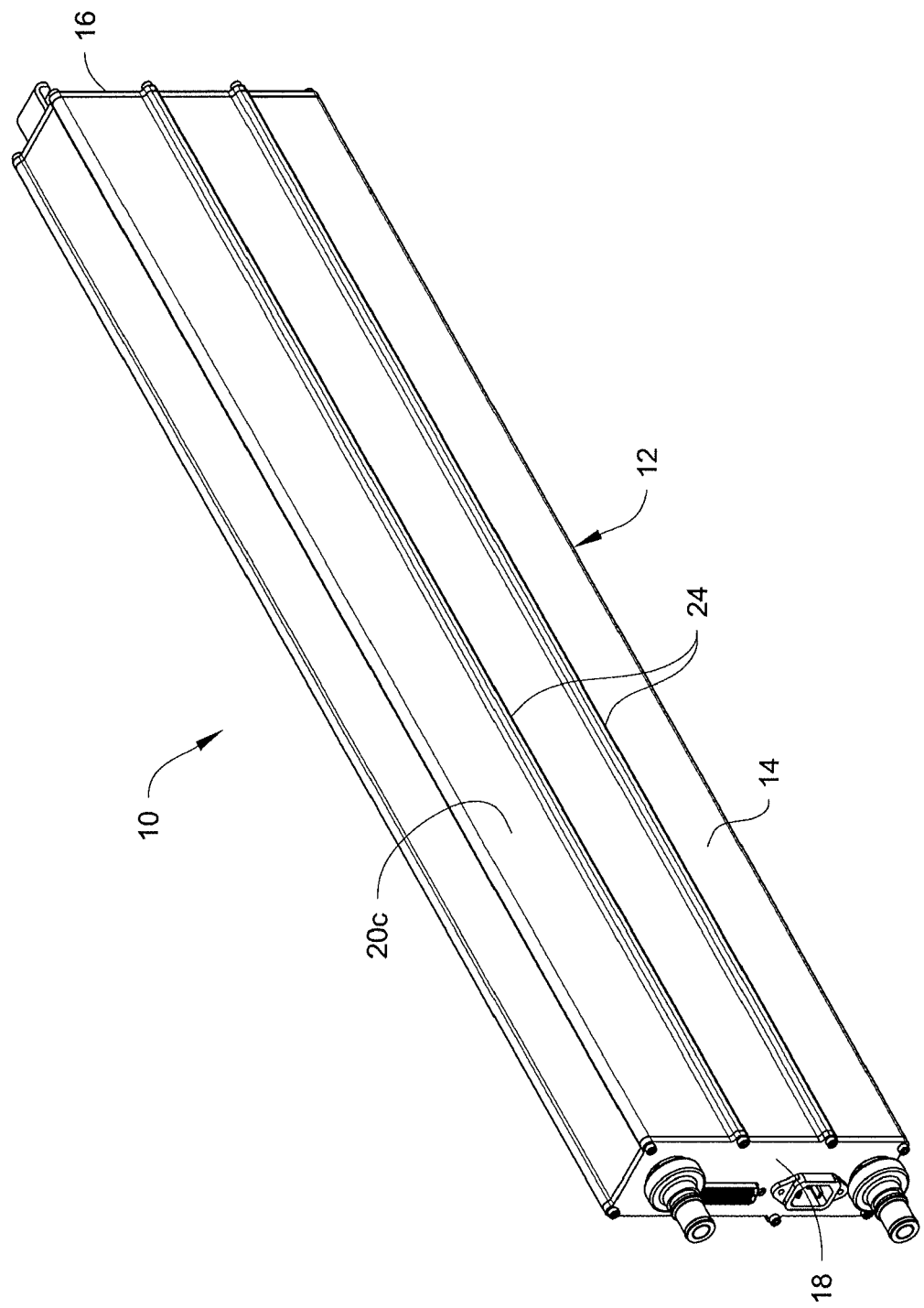
FIG. 2 is a perspective view from the rear of the liquid submersion cooled server computer of FIG. 1.

FIGS. 1 and 2 illustrate a liquid submersion cooled computer 10 in the form of a blade server computer. The concepts described herein can also be applied to a liquid submersion cooled personal computer.

The computer 10 includes a sealed, liquid-tight case 12 that contains therein a cooling liquid that submerges heat generating components of the computer so that the submerged components are in direct contact with the cooling liquid inside the case 12.

The cooling liquid can be, but is not limited to, a dielectric liquid. Dielectric liquids that can be used include, but are not limited to:
Engineered fluids like 3M™ Novec™
Mineral oil
Silicone oil
Natural ester-based oils, including soybean-based oils
Synthetic ester-based oils
The liquid can be single phase or two-phase. It is preferred that the liquid have a high enough thermal transfer capability to handle the amount of heat being generated by the submerged components so that the liquid does not change state. Enough of the liquid is present in the case 12 in order to submerge the heat generating components of the computer that one wishes to submerge. So in some instances the liquid may fill substantially the entire case 12, while in other instances the liquid may only partially fill the case 12.

The heat generating components in the case 12 that can be submerged are those that are electronically and/or thermally active. Examples of heat generating components that are electronically and/or thermally active are processors, power supply units, memory and storage devices, management hardware, and other components.

Figure 6:
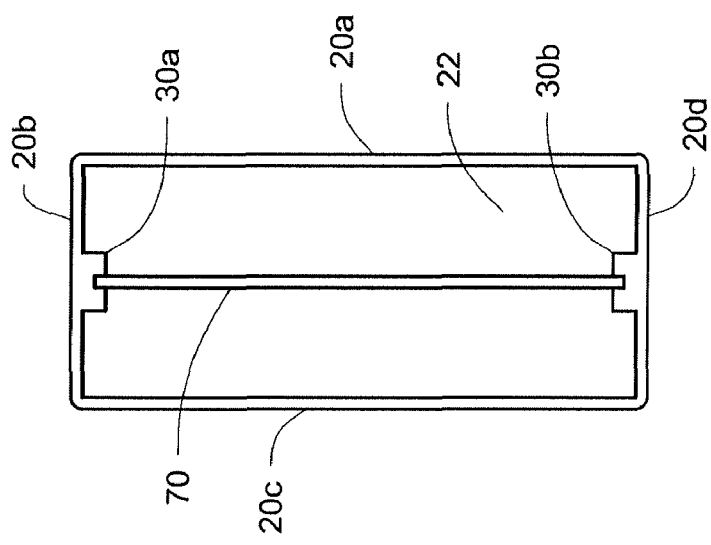
FIG. 6 is an end view of the extruded main body showing edges of the server logic board received in extruded slots.

With reference to FIGS. 1, 2 and 6, the case 12 includes a main body 14 that includes a plurality of walls 20a, 20b, 20c, 20d defining an interior space 22, a first end wall 16 closing a first open end of the main body and a second end wall 18 closing a second open end of the main body. When the first end wall 16 and the second end wall 18 are attached to the main body 14, a sealed, liquid-tight space is created for containing the server electronics and the cooling liquid. As will be described further below, the second end wall 18 includes a valved liquid inlet and a valved liquid outlet to allow cooling liquid to enter and exit the interior space. Therefore, a sealed, liquid-tight space is intended to mean that there is no unintentional leakage or other unintentional movement of cooling liquid from the case 12, despite there being the ability for cooling liquid to intentionally flow into and out of the case 12 through the inlet and the outlet.

The main body 14 is formed from an extruded material so that the walls 20a, 20b, 20c, 20d are integrally formed and the main body 14 is seamless. The extruded main body can be formed from any extrudable material that one finds suitable for use on a server. For example, the main body 14 can be extruded from a metal including, but not limited to, aluminum, or from a polymeric material such as a thermosetting plastic. Extruding the main body 14 from aluminum helps to reduce the weight of the resulting case 12, and using aluminum (or other metal) for the main body helps to dissipate heat from the cooling liquid inside the case via conduction. Further, extruding the main body 14 eliminates seams between the walls, so that the main body is seamless. This eliminates any leakage paths through the main body. The process of extruding metals and polymeric materials is well known to those of ordinary skill in the art.

Unlike conventional server and other computer housings which have holes or other openings in the housing to allow air to flow between the inside and outside of the housing, the main body 14 is devoid of any openings in the walls 20a-d so that the interior space 22 is not in communication with the exterior of the main body or ambient air through the walls.

Figure 3:
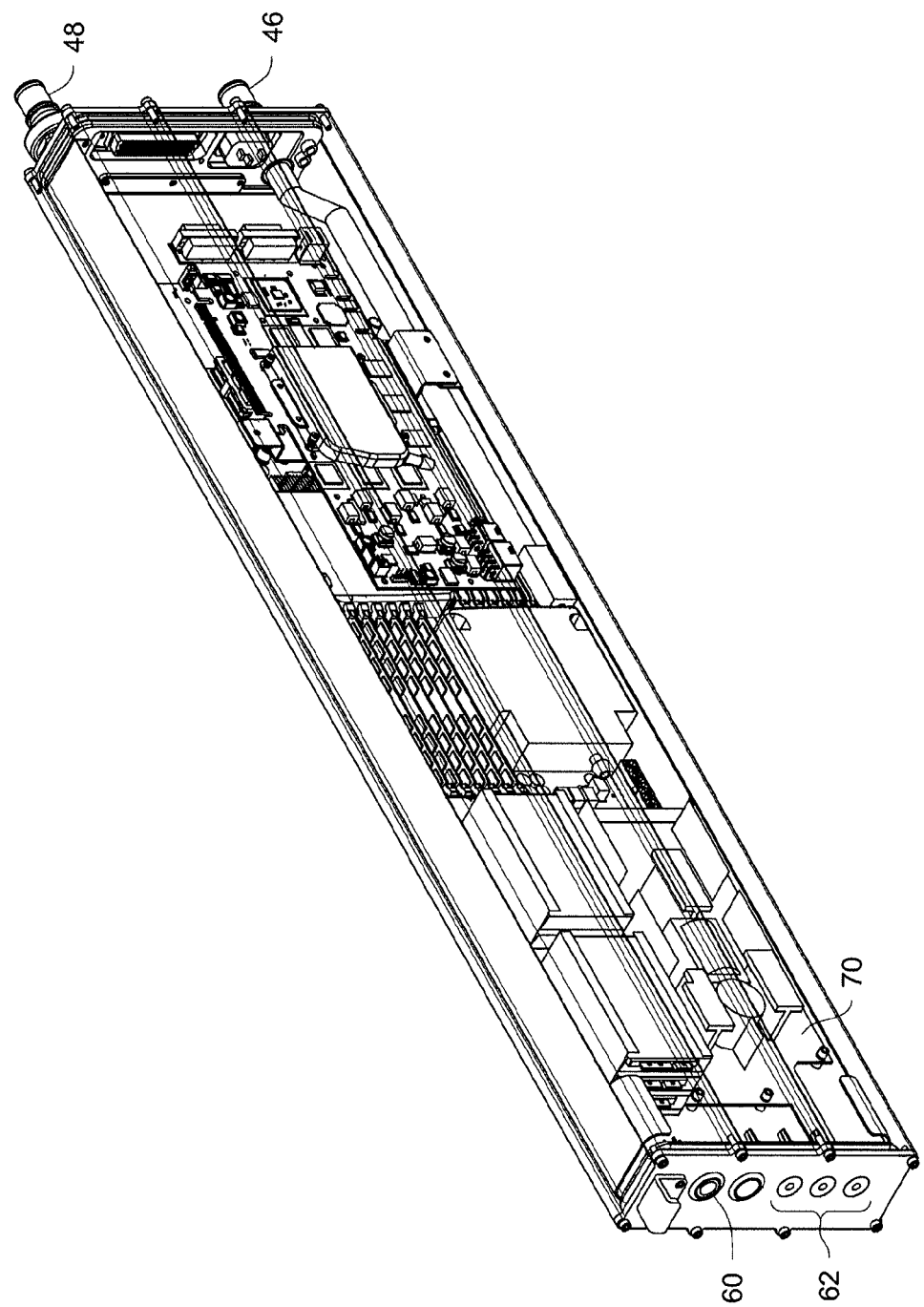
FIG. 3 is a perspective view similar to FIG. 1 with a side wall and top wall of the extruded main body made transparent to show the interior of the case.

As shown in FIGS. 1-3, the extruded main body 14 includes a plurality of raised ridges 24 formed on exterior surfaces of the plurality of walls 20a-d. The ridges 24 extend continuously from the first end of the main body to the second end and form means by which the end walls 16, 18 can be secured to the main body. In particular, the ridges 24 include threaded holes 26 at the first end and the second end (the threaded holes 26 at the first end of the main body are visible in FIG. 7) that receive threaded fasteners 28, such as screws, to secure the end walls 16, 18 to the main body. The threaded holes 26 do not extend through the entire length of the ridges 24. Instead, the threaded holes 26 need only extend a sufficient distance into each ridge 24 to receive the threaded fasteners.

In the embodiment of the main body illustrated in FIGS. 1-4, the interior surfaces of the walls 20a-d are generally smooth and flat. However, as shown in the embodiments in FIGS. 6 and 7, the two walls 20b, 20d disposed opposite each other can be formed with extruded slots 30a, 30b on their interior surfaces. The slots 30a, 30b extend continuously from the first end of the main body to the second end. As will be described further below, the slots 30a, 30b slidably receive opposite edges of a logic server board (FIG. 6) or opposite edges of a tray on which the logic server board is mounted (FIG. 7) to facilitate insertion and removal of the server board.

Figure 8:
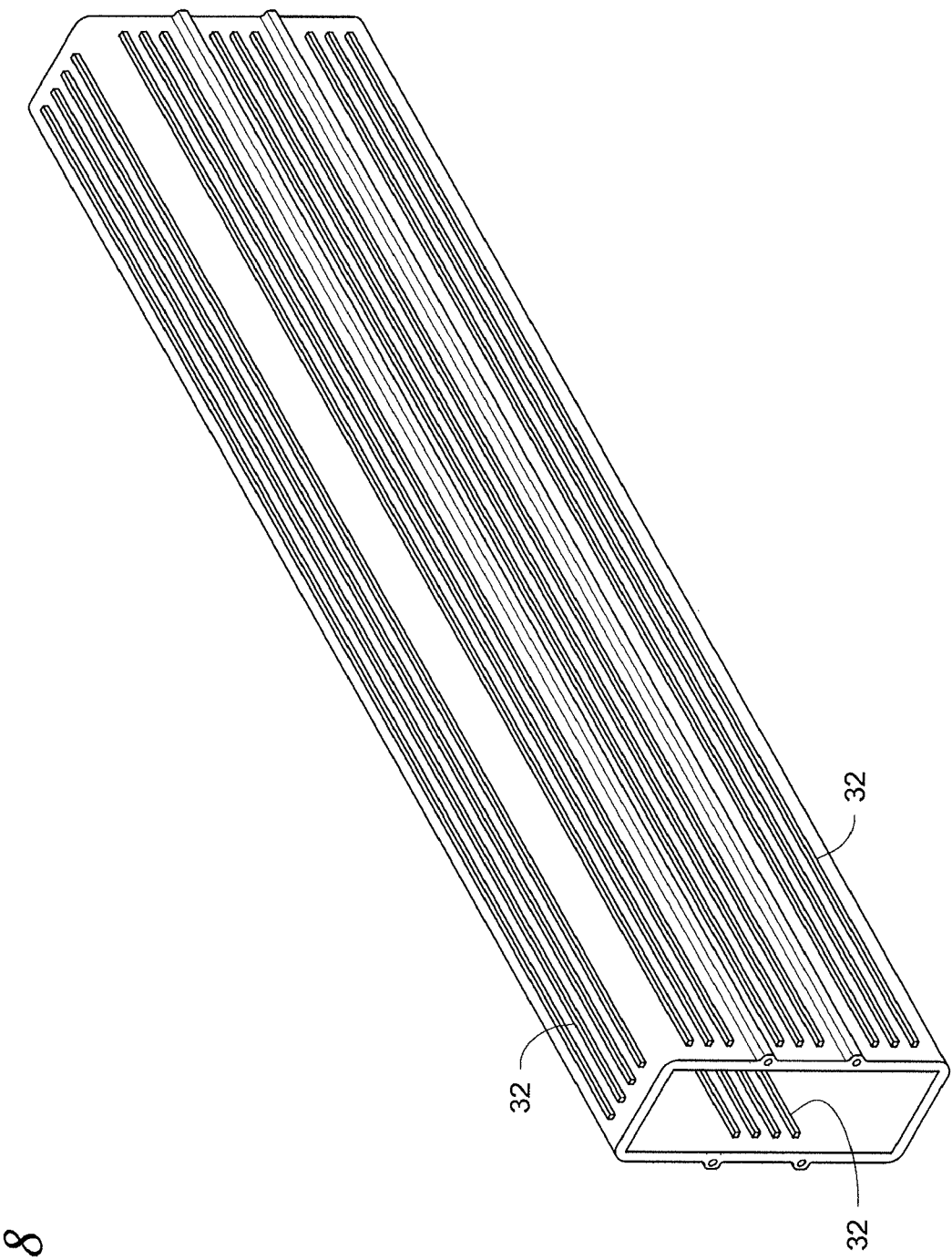
FIG. 8 is a perspective view of an embodiment of the extruded main body that includes heat exchange fins on the interior and exterior of the main body.

In addition to extruded slots, or separately from slots, the main body 14 can be extruded with a plurality of integral heat exchange fins 32 illustrated in FIG. 8. The heat exchange fins 32 can be formed on one or more interior surfaces of the walls 20a-d, and/or formed on one or more exterior surfaces of the walls 20a-d. The provision of heat exchange fins 32 would increase the conductive heat transfer from the cooling liquid inside the case to the ambient air.

Turning to FIGS. 1-5, the end walls 16, 18 are secured to the first and second ends of the main body, and are sealed therewith, to close the interior space 22 and define an interior volume for holding the cooling liquid. The end walls 16, 18 are preferably formed of the same material used to form the extruded main body 14, but could be formed of different material. The means for forming the seal between the end walls 16, 18 and the main body are the same for each end wall 16, 18 and will be described with respect to the end wall 18.

Figure 4:
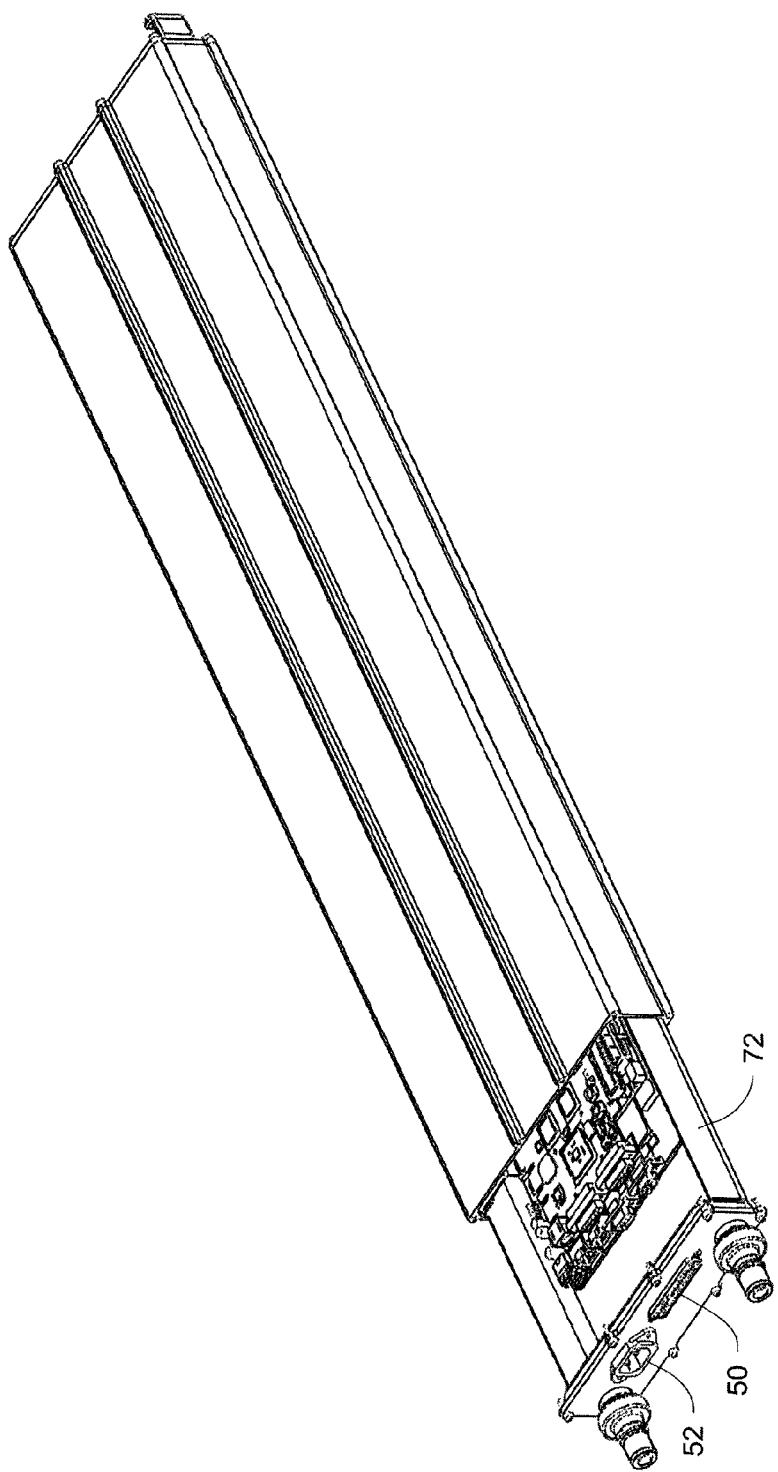
FIG. 4 shows the server computer with a tray assembly partially removed through the rear of the extruded case.
Figure 5:
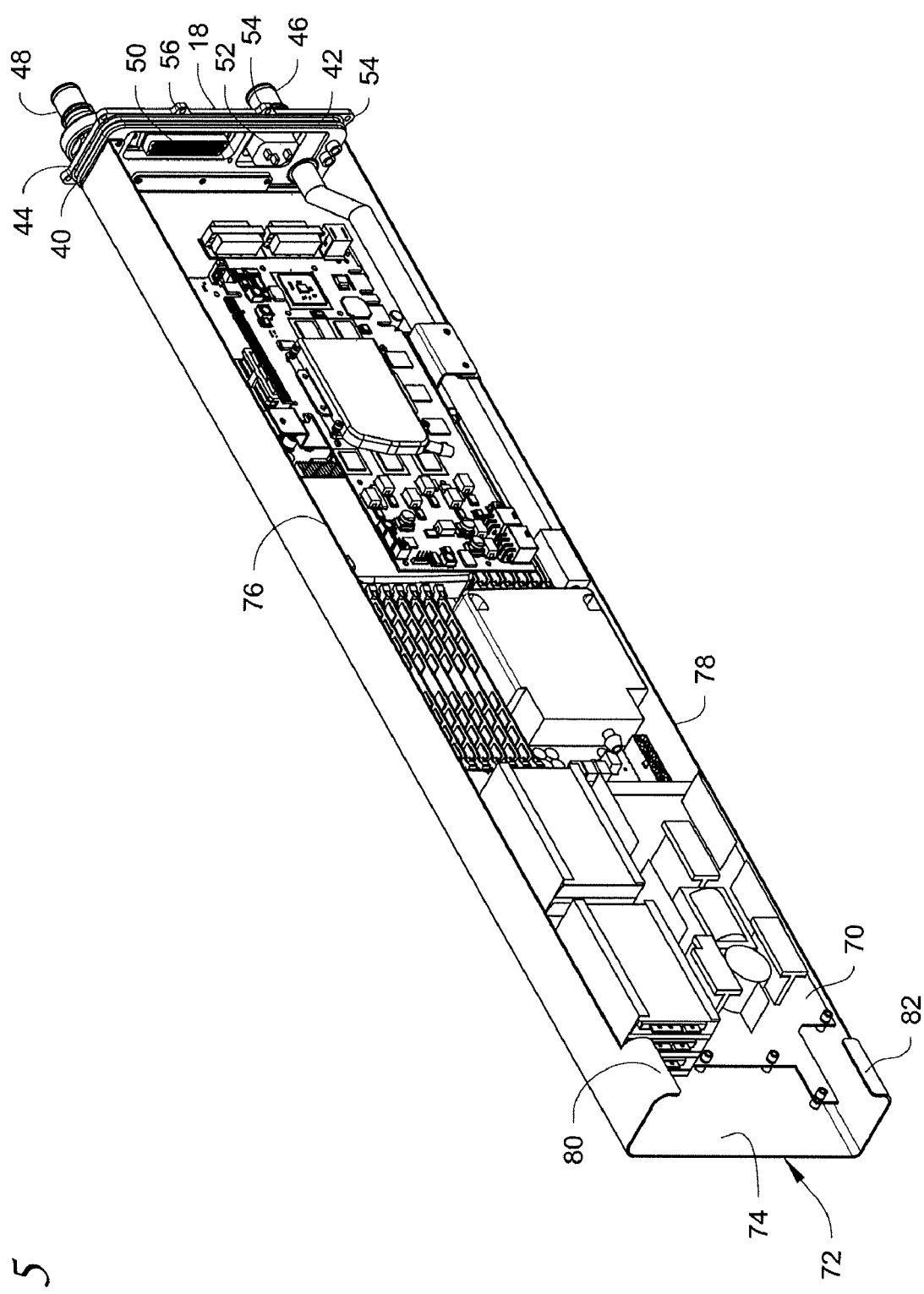
FIG. 5 shows the tray assembly.

With reference to FIGS. 4 and 5, the end wall 18 is generally rectangular in shape. A continuous raised lip 40 is formed on the inside surface of the end wall 18 and is sized and shaped to fit closely with the interior surfaces of the walls 20a-d at the second end. A sealing gasket 42 is disposed around the lip 40. The gasket 42 seals with the interior surfaces of the walls 20a-d, and a perimeter edge 44 of the end wall around the lip 40 is engaged with the end faces of the walls 20a-d. This creates a liquid-tight seal to prevent leakage of cooling liquid from the interior.

The end wall 18 is also provided with a liquid inlet 46 to allow cooling liquid to enter the case 14 and a liquid outlet 48 to allow cooling liquid to exit the case. The inlet 46 and the outlet 48 are provided with quick connect/disconnect valves that are designed to automatically open/close upon connection/disconnection with mating fluid conduits. Although the inlet 46 and the outlet 48 are described as being on the end wall 18, the locations of the inlet and the outlet could vary. For example, in certain embodiments, the inlet and outlet could be on the end wall 16. In addition, the inlet could be on one end wall and the outlet could be on the other end wall.

The inlet and the outlet are connected to a thermal dissipation or recovery device (not shown). The thermal dissipation or recovery device can be any device that is suitable for dissipating heat or allowing recovery of the heat from the cooling liquid from inside the case. For example, the device can be a simple heat exchanger, such as a radiator, for dissipating heat. Air or liquid could be used as the heat exchanging medium. In addition, the heat exchanger could be disposed underground to allow the relatively cool ground to cool the liquid. The external heat exchanger can take on a number of different configurations, as long as it is able to cool the liquid down to an acceptable temperature prior to being fed back into the case. Examples of thermal dissipation devices include, but are not limited to, a cooling stack, evaporation, and an in-ground loop. A pump is used to pump the cooling liquid from the case, to the thermal dissipation or recovery device, and back into the case. Further information on thermal dissipation or recovery devices can be found in U.S. Patent Application Publication No. 2009/0260777.

With continued reference to FIGS. 4 and 5, the end wall 18 further includes pass-through input/output (I/O) 50 and power 52 connectors. The I/O connector 50 engages with an input/output bus to pass external component I/O, storage I/O into and out of the case 14 to and from the server logic board and its components. The power connector 52 passes electrical power, such as AC power, into the case from an external power source. The connectors 50, 52 can be any type of connectors suitable for passing I/O and power into and from the case. Each of the connectors 50, 52 is sealingly fixed to the end wall 18 in a manner to prevent fluid leakage past the connectors.

The perimeter edge of the end wall 18 is provided with a plurality of spaced ears 54 that correspond in location to the ridges 24. The ears 54 abut against the ridges 24 and are provided with holes 56 through which the threaded fasteners 28 extend to secure the end wall 18 to the main body 14.

With reference to FIGS. 1 and 3, the end wall 16 is constructed somewhat similarly to the end wall 18 so as to seal with the first end of the main body in the same manner as the end wall 18. The end wall 16 includes a plurality of user interface devices such as an on/off button 60 and status indicators 62. Each interface device is sealingly fixed to the end wall 16 in a manner to prevent fluid leakage past the interface device.

The perimeter edge of the end wall 16 is provided with a plurality of spaced ears 64 that correspond in location to the ridges 24. The ears 64 abut against the ridges 24 and are provided with holes through which the threaded fasteners 28 extend to secure the end wall 16 to the main body 14.

A plurality of electronically and/or thermally active computer components that together form a complete computing system, for example forming a server computing system, are disposed within the case 12. Examples of computer components that are electronically and/or thermally active include, but are not limited to, processors, one or more power supply units, memory and storage devices, management hardware, and other components.

For a server computer, the computer components are mounted on a server logic board 70. In the embodiment illustrated in FIGS. 1-5, the logic board 70 is in turn mounted on a metal tray 72 that is slidably disposed within the interior space of the main body 14 to allow the tray 72 and the logic board 70 mounted thereon to be removed from and inserted into the main body as shown in FIG. 4. As shown in FIG. 5, the tray 72 includes a side wall 74 to which the logic board 70 is attached, and a pair of upturned flanges 76, 78 extending the length of the tray 72. One end of the tray 72 is fixed to the end wall 18 and is designed to be removed from second end of the main body 14 when the end wall 18 is removed. Alternatively, the tray can be fixed to the end wall 16 so as to removable from the main body through the first end when the end wall 16 is removed.

Two curved guides 80, 82 are formed on the flanges 76, 78 at the end opposite the end wall 18. The guides 80, 82 match the curvature between the walls 20a, 20c and the walls 20b, 20d to help stabilize the tray within the case and to guide the tray as it is removed from and installed into the case 12.

Figure 7:
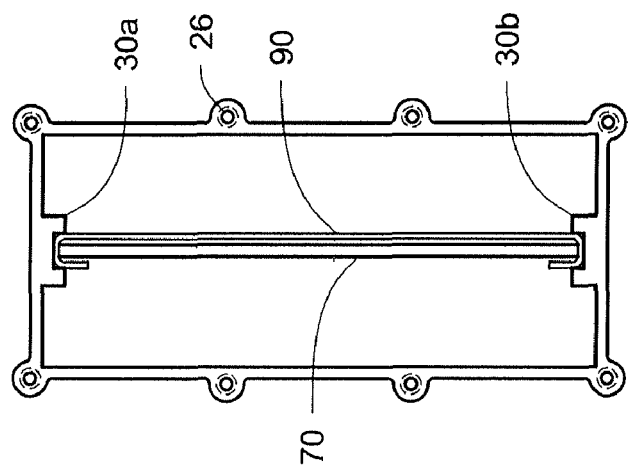
FIG. 7 is an end view of another embodiment showing edges of the tray assembly received in extruded slots.

With reference to FIG. 6, instead of using a tray, opposite edges of the logic board 70 can be slidably disposed within the extruded slots 30a, 30b. FIG. 7 illustrates an embodiment where opposite edges of a tray 90, to which the logic board 70 is attached, are slidably disposed within the extruded slots 30a, 30b.

Once the computing system is disposed within the case 12 and the end walls 16, 18 are secured to the main body 14, the case is filled with the cooling liquid. The cooling liquid is introduced through the inlet 46. The interior space of the case is filled with the cooling liquid to a level to submerge the desired computing components in the cooling liquid. The cooling liquid is also filled to the level of the outlet 48. If only certain of the components need to be submerged, and those components are located lower on the logic board, then the liquid need only fill a portion of the interior space. In that instance, the location of the outlet 48 would need to be changed so as to be lower on the end wall 18 at or below the level of the liquid, or the outlet location 48 can remain the same but a fluid connection established between the outlet and the liquid.

The concepts described may be embodied in other forms without departing from the spirit or novel characteristics thereof. The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. A liquid submersion cooled server computer, comprising:
 a liquid-tight case having a main body that includes a plurality of walls defining an interior space, the main body having a first end and a second end, the main body being seamless and formed from an extruded material, and the plurality of walls of the main body are devoid of openings therethrough so that the interior space is not in communication with an exterior of the main body through the plurality of walls;
 the case further includes a first end wall closing the first end and a second end wall closing the second end;
 a server logic board disposed in the interior space of the main body, and heat generating computer components, including a processor, disposed on the server logic board;
 a cooling liquid disposed within the interior space and submerging the plurality of heat generating computer components, including the processor, disposed on the server logic board; and
 a liquid inlet for cooling liquid and a liquid outlet for cooling liquid provided on the first end wall or the second end wall, wherein the plurality of walls include two walls disposed opposite each other, and extruded slots formed on the two walls within the interior space.

2. The liquid submersion cooled server computer of claim 1, wherein the first end wall and the second end wall are separate from and attached to the main body, and there is a seal between the first end wall and the main body and a seal between the second end wall and the main body to prevent leakage of the cooling liquid.

3. The liquid submersion cooled server computer of claim 1, wherein the extruded material comprises aluminum or plastic.

4. The liquid submersion cooled server computer of claim 1, further comprising a tray having opposite edges that are slideably disposed within the slots, and the server logic board is attached to the tray.

5. The liquid submersion cooled server computer of claim 1, wherein the server logic board has opposite edges that are slideably disposed in the slots.

6. The liquid submersion cooled server computer of claim 1, wherein the first end wall or the second end wall include pass-through input/output and power connectors.

7. A liquid submersion cooled server computer, comprising:
 a liquid-tight case having a main body that includes a plurality of walls defining an interior space, the main body having a first end and a second end, the main body being seamless and formed from an extruded material, and the plurality of walls of the main body are devoid of openings therethrough so that the interior space is not in communication with an exterior of the main body through the plurality of walls;

the case further includes a first end wall closing the first end and a second end wall closing the second end;

a server logic board disposed in the interior space of the main body, and heat generating computer components, including a processor, disposed on the server logic board;

a cooling liquid disposed within the interior space and submerging the plurality of heat generating computer components, including the processor, disposed on the server logic board;

a liquid inlet for cooling liquid and a liquid outlet for cooling liquid provided on the first end wall or the second end wall; and a plurality of ridges formed on outer surfaces of the plurality of walls, the ridges extend from the first end to the second end, and the ridges include threaded holes at the first end and the second end that receive threaded fasteners to secure the first end wall and the second end wall to the main body.

8. The liquid submersion cooled server computer of claim 1, wherein the cooling liquid is a dielectric cooling liquid.

9. The liquid submersion cooled server computer of claim 4, wherein the tray is attached to the first end wall or the second end wall.

10. The liquid submersion cooled server computer of claim 1, further comprising a plurality of heat exchange fins formed on an interior surface of the main body within the interior space and a plurality of heat exchange fins formed on an exterior surface of the main body.

11. The liquid submersion cooled server computer of claim 7, wherein the first end wall and the second end wall are separate from and attached to the main body, and there is a seal between the first end wall and the main body and a seal between the second end wall and the main body to prevent leakage of the cooling liquid.

12. The liquid submersion cooled server computer of claim 7, wherein the extruded material comprises aluminum or plastic.

13. The liquid submersion cooled server computer of claim 7, wherein the plurality of walls include two walls disposed opposite each other, and extruded slots formed on the two walls within the interior space.

14. The liquid submersion cooled server computer of claim 13, further comprising a tray having opposite edges that are slideably disposed within the slots, and the server logic board is attached to the tray.

15. The liquid submersion cooled server computer of claim 13, wherein the server logic board has opposite edges that are slideably disposed in the slots.

16. The liquid submersion cooled server computer of claim 7, wherein the cooling liquid is a dielectric cooling liquid.

17. The liquid submersion cooled server computer of claim 14, wherein the tray is attached to the first end wall or the second end wall.

18. The liquid submersion cooled server computer of claim 7, further comprising a plurality of heat exchange fins formed on an interior surface of the main body within the interior space and a plurality of heat exchange fins formed on an exterior surface of the main body.

* * * * *